United States Patent
Jung et al.

(10) Patent No.: US 8,022,713 B2
(45) Date of Patent: Sep. 20, 2011

(54) METHOD FOR MEASURING ANTENNA CHARACTERISTICS OUT OPERATIONAL FREQUENCY RANGE OF CHAMBER

(75) Inventors: Young-Bae Jung, Daejon (KR); Soon-Ik Jeon, Daejon (KR); Chang-Joo Kim, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 370 days.

(21) Appl. No.: 12/442,167

(22) PCT Filed: Sep. 21, 2007

(86) PCT No.: PCT/KR2007/004652
§ 371 (c)(1),
(2), (4) Date: Mar. 20, 2009

(87) PCT Pub. No.: WO2008/038966
PCT Pub. Date: Apr. 3, 2008

(65) Prior Publication Data
US 2010/0039334 A1 Feb. 18, 2010

(30) Foreign Application Priority Data
Sep. 27, 2006 (KR) .................. 10-2006-0094381

(51) Int. Cl.
*G01R 27/04* (2006.01)
*G01R 29/10* (2006.01)

(52) U.S. Cl. ........ 324/637; 324/633; 324/636; 324/639; 343/703

(58) Field of Classification Search .................. None
See application file for complete search history.

(56) References Cited

U.S. PATENT DOCUMENTS

| | | | |
|---|---|---|---|
| 4,754,496 A | 6/1988 | Fishkin et al. | |
| 6,563,327 B1 | 5/2003 | Leferink | |
| 7,076,858 B2 * | 7/2006 | Eckstein et al. | 29/593 |
| 2004/0124853 A1 * | 7/2004 | Moller et al. | 324/633 |
| 2009/0160706 A1 * | 6/2009 | Oh et al. | 342/359 |
| 2010/0109957 A1 * | 5/2010 | Moon et al. | 343/703 |

FOREIGN PATENT DOCUMENTS

| | | |
|---|---|---|
| JP | 2004-080607 A | 3/2004 |
| JP | 2004-301514 A | 10/2004 |
| KR | 1020040055671 A | 6/2004 |
| KR | 1020060023246 A | 3/2006 |
| KR | 1020060080314 A | 7/2006 |

OTHER PUBLICATIONS

Niels Hegge, et al; "Development of Reverberation Chamber for Accurate Measurements of Mobile Phone and Mobile Phone Antennas", Antenna and Propagation Society International Symposium, IEE, pp. 55-58, 2004.
International Search Report: mailed Jan. 2, 2008; PCT/KR2007/004652.

* cited by examiner

*Primary Examiner* — Trinh Dinh
(74) *Attorney, Agent, or Firm* — Ladas & Parry LLP

(57) ABSTRACT

There is provided to a method for measuring antenna characteristics operating in an out-of-operational frequency range of a chamber, in the chamber having a predetermined operational frequency range, including the steps of: a) measuring reflected wave characteristics of the out-of-operational frequency range generated within the chamber; b) measuring the characteristics of a measurement target antenna operating in the out-of-operational frequency range of the chamber; and c) measuring final characteristics of the measurement target antenna by compensating the characteristic data of the measurement target antenna measured in the step b) for reflected wave data measured in the step a).

4 Claims, 1 Drawing Sheet

[Fig. 1]
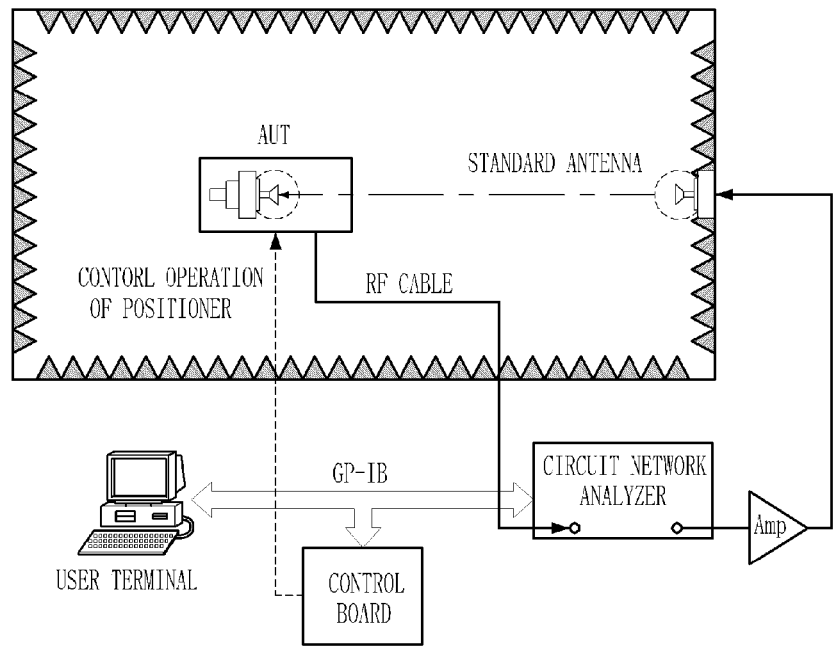
[Fig. 2]
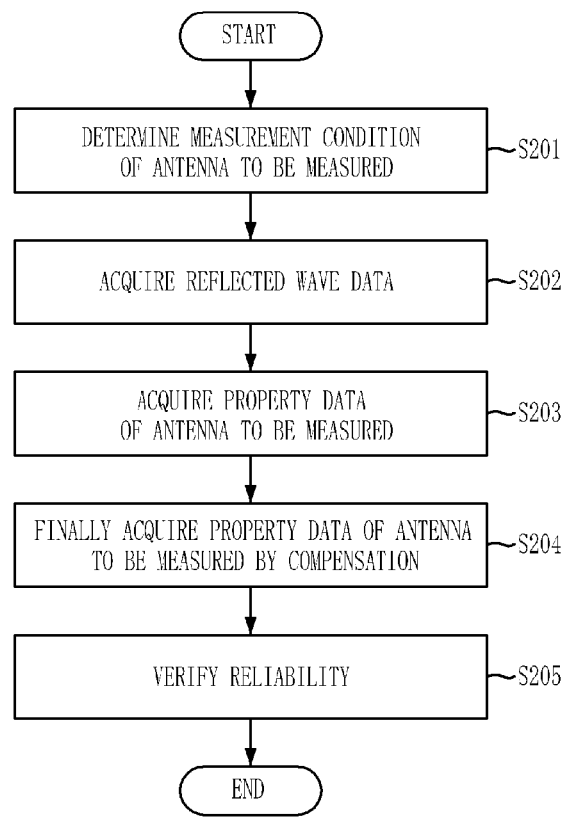

METHOD FOR MEASURING ANTENNA CHARACTERISTICS OUT OPERATIONAL FREQUENCY RANGE OF CHAMBER

Related Applications

This application is a 371 of PCT/KR2007/004652 filed Sep. 21,2007 which claims priority under U.S.C. 119 to an application REPUBLIC OF KOREA 10-2006-0094381 filed Sep. 27, 2006 which are incorporated herein by reference.

TECHNICAL FIELD

The present invention relates to an antenna characteristic measurement technique; and more particularly, to a method for measuring antenna characteristics, which measures the characteristics of an antenna operating in a frequency range out of an operational frequency range in a chamber having a predetermined operational frequency range.

BACKGROUND ART

Generally, an anechoic chamber is used to measure the characteristics (transmission and reception gains, radiation patterns, etc.) of an antenna. In the anechoic chamber, a predetermined frequency range in which the chamber is operated (hereinafter, operational frequency range) is set, and it is designed to remove signals reflected or scattered by the wall surface within the chamber, an installation structure, or the like in such an operational frequency range by an absorber. However, as for the signals of a range out of the operational frequency range (hereinafter, out-of-operational frequency range) of the chamber, the characteristic of removal using an absorber decreases. Thus, reflection or scattering occurs by the wall surface within the chamber, an installation structure, or the like. Such reflected or scattered signals affect the measurement of antenna characteristics, which leads to an error in the result of measurement of antenna characteristics. In other words, if a frequency range (hereinafter, operating frequency range) in which an antenna to be measured (hereinafter, measurement target antenna) operates is included in the operational frequency range of the corresponding chamber, it is possible to accurately measure antenna characteristics without any effects of the reflected or scattered signals. Otherwise, if the operating frequency range of the measurement target antenna is out of the operational frequency range of the corresponding chamber, it is difficult to accurately measure antenna characteristics due to effects of the reflected or scattered signals.

As mentioned above, each chamber having a predetermined operational frequency range has the limitation that it cannot accurately measure the characteristics of an antenna having an operating frequency range out of this operational frequency range. Thus, in order to measure the characteristics of an antenna having such an operating frequency range, a separate chamber has to be used. If no separate chamber exists, it should be additionally installed.

DISCLOSURE OF INVENTION

Technical Problem

An embodiment of the present invention is directed to providing a method for measuring antenna characteristics, which measures the characteristics of an antenna operating in a frequency range out of an operational frequency range in a chamber having a predetermined operational frequency range.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a method for measuring antenna characteristics operating in an out-of-operational frequency range of a chamber, in the chamber having a predetermined operational frequency range, including the steps of: a) measuring reflected wave characteristics of the out-of-operational frequency range generated within the chamber; b) measuring the characteristics of a measurement target antenna operating in the out-of-operational frequency range of the chamber; and c) measuring final characteristics of the measurement target antenna by compensating the characteristic data of the measurement target antenna measured in the step b) for reflected wave data measured in the step a).

Advantageous Effects

In accordance with the present invention, an operational frequency range of an existing chamber can be expanded by using reflected waves generated in an out-of-operational frequency range of the existing chamber in order to measure antenna characteristics having an operating frequency range out of a predetermined operational frequency range in the existing chamber having this operational frequency range.

BRIEF DESCRIPTION OF THE DRAWINGS

FIG. 1 is a view showing the configuration of an antenna characteristic measurement system to which the present invention is applied.

FIG. 2 is a flowchart describing a method for measuring antenna characteristics in accordance with a preferred embodiment of the present invention.

BEST MODE FOR CARRYING OUT THE INVENTION

The advantages, features and aspects of the invention will become apparent from the following description of the embodiments with reference to the accompanying drawings, which is set forth hereinafter, and thus, the present invention will be easily carried out by those skilled in the art. Further, in the following description, well-known arts will not be described in detail if it seems that they could obscure the invention in unnecessary detail. Hereinafter, a preferred embodiment of the present invention will be described in detail with reference to the accompanying drawings.

FIG. 1 is a view showing the configuration of an antenna characteristic measurement system to which the present invention is applied.

As shown in FIG. 1, the antenna characteristic measurement system to which the present invention is applied includes a circuit network analyzer, a control board, and a user terminal, in addition to a chamber for measuring antenna characteristics.

A predetermined operational frequency range of the chamber is set, and the chamber is designed in such a manner as to determine the size of the chamber, the type and specification of an absorber to be attached to the inside of the chamber and so forth based on the operational frequency range. For antenna measurement, two antennas are arranged horizontally at a constant distance between them. Generally, one of the two antennas is a transmission antenna which transmits signals, and the other one is a reception antenna which receives the signals radiated from the transmission antenna. Any one of the transmission antenna and the reception antenna becomes a measurement target antenna, and the other one is a standard antenna whose characteristics are acknowledged. In the embodiment of the invention, for example, the right antenna of the two antennas horizontally arranged within the chamber is installed as the standard antenna serving as the transmission antenna, while the left antenna thereof is installed as the measurement target antenna serving as the reception antenna. In this case, in order to check the characteristics of the measurement target antenna for a forward direction, the measurement target antenna is preferably placed on the upper end of a positioner for allowing rotation in a forward direction. Using such a chamber configuration, a procedure of measuring the characteristics of a measurement target antenna which operates in an out-of-operational frequency range of a chamber will be described in detail with reference to FIG. 2.

The circuit network analyzer with two terminals connected to the measurement target antenna and the standard antenna by an RF cable transmits data of signals (phase, intensity, etc.) transmitted between the measurement target antenna and the standard antenna to the user terminal. The user terminal has the function of converting, storing, and outputting such data of signals in a desired format. The circuit network analyzer and the user terminal may be connected to the control board, for example, by a GP-IB (General Purpose Interface Bus) method. The control board has the function of controlling the operation of the positioner where the measurement target antenna is placed, in addition to controlling the connection of the circuit network analyzer and the user terminal.

In such an antenna characteristic measurement system, preconditions will be described for the convenience of description before describing a method for measuring antenna characteristics in accordance with an embodiment of the present invention. First, an operational frequency range of the chamber is assumed to be f2~f3, and an operating frequency of the measurement target antenna is assumed to be f1. Here, since the present invention is for measuring the characteristics of an antenna operating in an out-of-operational frequency range of a chamber, f1 is out of the frequency range of f2~f3. Further, the antenna used in the chamber includes three types, such as a standard antenna, AUT (Antenna Under test) 1 for measuring data representing the reflected wave characteristics (hereinafter, reflected wave data) of the chamber, and AUT2 serving as the measurement target antenna. Under the premise, the method for measuring antenna characteristics will be described in detail hereinafter.

FIG. 2 is a flowchart describing a method for measuring antenna characteristics in accordance with a preferred embodiment of the present invention.

First, measurement conditions (e.g., measurement distance) are determined in consideration of the conditions (operating frequency, antenna size and so forth) of a measurement target antenna in step S201. According to these measurement conditions, a standard antenna, AUT1, and AUT2 to be described later are installed.

Next, reflected wave data generated in an out-of-operational frequency range of a chamber is acquired in step S202. For this, a standard antenna is installed as a transmission antenna, and AUT1 is installed as a reception antenna. Here, AUT1 has the same operating frequency f1 as the measurement target antenna, and is assumed to be an antenna whose characteristic data is already measured and acquired. The acquired characteristic data of AUT1 is referred to as DATA1(N). Data of signals (phase, intensity, etc.) transmitted between AUT1 and the standard antenna in every direction of AUT1 is transmitted to a user terminal through a circuit network analyzer, and is converted into data representing the characteristics (gain, radiation pattern, etc.) of AUT1 (hereinafter, AUT1 characteristic data) in the user terminal, and the characteristic data of AUT1 is referred to as DATA1(A).

While the acquired characteristic data DATA1(N) of AUT1 is accurate characteristic data of AUT1, the characteristic data DATA1(A) of tAUT1 acquired through an experiment in the chamber is data involving the effect of reflected waves. This is because the signal corresponding to the frequency f1 used for measurement of the characteristics of AUT1 is not absorbed by an absorber within the chamber but reflected and inputted into AUT1. Therefore, reflected wave data can be acquired by the following equation:

$$\text{Reflected wave data} = \text{DATA1(A)} - \text{DATA1(N)} \qquad \text{Eq. (1)}$$

Further, characteristic data of the measurement target antenna AUT2 is acquired in step S203. For this, a standard antenna is installed as a transmission antenna, and AUT2 is installed as a reception antenna. Here, like AUT1, AUT2 has an operating frequency f1, and data of signals transmitted between AUT2 and the standard antenna in every direction of AUT2 is converted into characteristic data of AUT2, and the characteristic data of AUT2 is referred to as DATA2(A). The characteristic data DATA2(A) of AUT2 acquired through an experiment in the chamber is also data involving the effect of reflected waves.

In a next step S204, in order to acquire accurate characteristic data of AUT2 obtained by eliminating the effect of reflected waves from DATA2(A) acquired in step S203, final characteristic data DATA2(N) of the measurement target antenna is obtained by compensating DATA2(A) acquired in step S202 for the reflected wave data as follows:

$$\text{DATA2(N)} = \text{DATA2(A)} - \text{reflected wave data} \qquad \text{Eq. (2)}$$

If there exists a separate chamber having an operational frequency range including the operating frequency f1 of AUT2 and accurate characteristic data of AUT2 is acquired by using this separate chamber, the method for measuring antenna characteristics in accordance with the embodiment of the present invention may further include the step S205 of verifying the reliability of DATA2(N) acquired in step S204. In other words, the reliability of the method for measuring antenna characteristics in accordance with the present invention can be verified depending on the degree of consistency between DATA2(N) and the characteristic data of AUT2 measured in a separate chamber having an operational frequency range.

The method of the present invention as described above may be implemented by a software program that is stored in a computer-readable storage medium such as CD-ROM, RAM, ROM, floppy disk, hard disk, optical magnetic disk, or the like. This process may be readily carried out by those skilled in the art, and therefore, details of thereof are omitted here.

While the present invention has been described with respect to the particular embodiments, it will be apparent to those skilled in the art that various changes and modifications may be made without departing from the spirit and scope of the invention as defined in the following claims.

The invention claimed is:

1. A method for measuring antenna characteristics operating in an out-of-operational frequency range of a chamber, in the chamber having a predetermined operational frequency range, comprising the steps of:
   a) measuring reflected wave characteristics of the out-of-operational frequency range generated within the chamber;
   b) measuring the characteristics of a measurement target antenna operating in the out-of-operational frequency range of the chamber; and
   c) calculating final characteristics of the measurement target antenna by compensating the characteristic data of the measurement target antenna measured in the step b) for reflected wave data measured in the step a).

2. The method as claimed in claim 1, wherein the step a) includes the steps of:
   a1) measuring the characteristics of the antenna for reflected wave measurement operating in the out-of-operational frequency range in the chamber; and
   a2) outputting as the reflected wave data the difference between the original characteristics of the antenna for reflected wave measurement and the characteristics measured in the step a1).

3. The method as claimed in claim 1, wherein the step c) calculates the difference between the characteristics of the measurement target antenna measured in the step b) and the reflected wave characteristics measured in the step a) outputted as the final characteristics of the measurement target antenna.

4. The method as claimed in claim 1, further comprising the step d) of judging the reliability of the final characteristics of the measurement target antenna measured in the step c).

* * * * *